United States Patent
Fischer et al.

(10) Patent No.: US 8,391,013 B2
(45) Date of Patent: Mar. 5, 2013

(54) SILICON-CERAMIC COMPOSITE SUBSTRATE

(75) Inventors: Michael Fischer, Uhlstädt-Kirchhasel (DE); Heike Bartsch De Torres, Ilmenau (DE); Martin Hoffmann, Langewiesen (DE); Jens Müller, Ilmenau (DE); Beate Pawlowski, Jena (DE); Stefan Barth, Jena (DE)

(73) Assignees: Technische Universitat Ilmenau, Ilmenau (DE); Fraunhofer-Gesellschaft zur Foerderung der Angewandten Forshung E.V., Munich (DE)

( * ) Notice: Subject to any disclaimer, the term of this patent is extended or adjusted under 35 U.S.C. 154(b) by 217 days.

(21) Appl. No.: 12/746,759

(22) PCT Filed: Dec. 4, 2008

(86) PCT No.: PCT/EP2008/066837
§ 371 (c)(1),
(2), (4) Date: Jun. 7, 2010

(87) PCT Pub. No.: WO2009/071645
PCT Pub. Date: Jun. 11, 2009

(65) Prior Publication Data
US 2010/0254099 A1    Oct. 7, 2010

(30) Foreign Application Priority Data
Dec. 6, 2007    (DE) .................. 10 2007 059 609

(51) Int. Cl.
*H05K 7/00*    (2006.01)

(52) U.S. Cl. ..................................... 361/748
(58) Field of Classification Search ........................ None
See application file for complete search history.

(56) References Cited

U.S. PATENT DOCUMENTS

| 7,623,340 B1* | 11/2009 | Song et al. ............ 361/502 |
| 2002/0016396 A1* | 2/2002 | Wong et al. ............ 524/394 |
| 2010/0157508 A1* | 6/2010 | Lim et al. ............ 361/320 |
| 2011/0043987 A1* | 2/2011 | Das et al. ............ 361/679.02 |

OTHER PUBLICATIONS

Fischer et al., "Bonding of Ceramic and Silicon—New options and Applications", Smart Systems Integration, 2007, pp. 477-479.
Stubenrauch et al., "Black Silicon—New Functionalities in Microsystems", J. Micromech. Microeng. 16 (2006) S82-S87.
Rusu et al., "LTCC Interconnects in Microsystems", J. Micromech. Microeng. 16 (2006) S13-S18.
Fischer et al., "Realisierung Neuartiger Verbindungsverfahren Zwischen Selbstorganiesierten, Nanostrukturierten Siliciumoberflachen and Adaptierten", Kick-Off-Meeting "Mikro-Nano-Integration" Projekt "NanoSilKe", Fraunhofer IZM Berlin, May 10, 2007, 13 pages.

* cited by examiner

*Primary Examiner* — Andre Allen
(74) *Attorney, Agent, or Firm* — Stuart H. Mayer, Esq.; Mayer & Williams PC

(57) ABSTRACT

A silicon-ceramic composite substrate includes a low-temperature ceramic having at least one pre-formed ceramic layer and a silicon substrate. The low-temperature ceramic forms a carrier layer and the silicon substrate surface has a contact area with nanostructures) that completely penetrate into the low-temperature ceramic.

14 Claims, 2 Drawing Sheets

SILICON-CERAMIC COMPOSITE SUBSTRATE

BACKGROUND OF THE INVENTION

The present invention relates to a composite substrate made from silicon and ceramic.

The integration of semiconductor chips on ceramic carrier substrates, which may incorporate a wiring structure and passive electronic components and which serves as tan electrical connection of a complete system, is an established method. The bond between the completed semi-conductor chip and the ceramic carrier is usually achieved by means of bonding methods such as flip-chip bonds, different soldering techniques or adhesion methods with subsequent wire-bonding for the creation of the electrical connection.

These connection techniques generally require additional auxiliary means such as metallization, soldering, or special adhesives, and usually require a high calibration and installation efforts.

It is also known how to manufacture multi-layer circuits using sintered ceramic carriers with low-temperature co-fired ceramics (LTCC). In this way conduction paths, resistors, coils or also fluid channels can be produced. The elements can be applied by means of screen printing or photochemical processes. The unprocessed or green ceramic foils are individually structured, stacked thereafter, and laminated. Finally a defined sintering profile is executed with a peak temperature of about 850-900° C.

A more recent method has been experimentally introduced in [C. Rusu et. al, LTCC interconnects in microsystems, Journal of Micromechanics and Microengineering, 16 (2006), page 13-18].

It initially describes the possibility of connecting an LTCC ceramic with silicon by means of anodic bonding. Among other things, the connection of a 2×2 cm$^2$ sized ceramic substrate with a silicon wafer by means of anodic bonding is shown. In this context a special low temperature ceramic (Low Temperature Cofired Ceramics—LTCC) is utilized which permits the anodic bonding of the ceramic on silicon because of its consistency and an average to low thermal expansion coefficient. Nonetheless the initially fired low-temperature ceramic must be prepared for the bonding process through additional, elaborate process steps, such as grinding and polishing. Furthermore an additional device is required for anodic bonding. Even small imperfections in the surface or deposited particles lead to gas enclosures that negatively affect the durability of the connection.

A simple silicon-ceramic bond can be produced by means of laminating and sintering of the bond partners [M. Fischer et. al, Bonding of ceramic and silicon—new options and applications, Smart Systems Integration, 2007] by initially laminating the unprocessed or green ceramic onto the nano-structured silicon surface. A sintering process is subsequently performed. As a result elaborate polishing of the ceramic is omitted.

It is the purpose of the present invention to provide a silicon-ceramic composite substrate of high mechanical strength and variable functionality that can be manufactured economically and free of auxiliary materials and which can be further processed using known, standard semiconductor process technology.

SUMMARY

A silicon-ceramic includes a low-temperature ceramic having at least one pre-structured ceramic layer and a silicon substrate. The surface of the silicon substrate has a contact area that includes nanostructures which completely penetrate the low-temperature ceramic. The low-temperature ceramic forms a carrier layer for the silicon substrate, which can be processed by means of known semi-conductor technologies.

Preferably the nanostructures are formed from so-called "black silicon," which features needle-like spikes.

It is also possible, however, to provide other nano-structures in the contact area of the substrate, which can be produced, for example, through polishing, etching or other processes applied to the silicon substrate surface.

The thermal expansion behavior of the low-temperature ceramic is advantageously adapted to the expansion behavior of the silicon substrate, so that stress at the connection location is minimized.

For the manufacture of the silicon-ceramic composite substrates, green ceramic foils are initially pre-formed in one or more layers and include conduction paths, vias (plated through-holes) and fluid channel as well as possibly resistors, capacitors and/or coils.

The pre-formed features may be implemented using standard methods, such as punching, via-filling, screen printing, or laser treatment, for example. The ceramic foils are subsequently layered on top of each other for the manufacture of devices with a desired functionality or for the manufacture of a carrier layer.

A nano-structure is applied onto the silicon substrate. Thereafter the silicon substrate is laminated on the carrier layer subject to the effect of temperature and pressure and the composite structure that is created is sintered.

Since the bonding mechanism that is used is different from anodic bonding, the need for sodium-containing glasses that are required for the anodic bonding of low-temperature ceramics is advantageously avoided. This bonding mechanism produces a semiconductor process-compatible composite substrate that forms the basis for different MEMS (Micro-Electro-Mechanical System) applications.

One advantage of the invention is that the resulting composite substrate may be used to perform a wide range of functions and offers high mechanical strength. In addition, different functionalities can be integrated into the carrier layer by means of the modified LTCC technology.

It has proven to be particularly advantageous that the sintering of the LTCC ceramic can be entirely avoided since this occurs integrally with the manufacture of the silicon ceramic composite substrate. In addition, due to the elimination of the otherwise initially required sintering process of the LTCC, it is possible, to manufacture a greater number of LTCC structures because they can be assembled on-demand as layers of green ceramic foils.

Additional details and advantages of the invention can be discerned from the description part that follows in which the invention is further explained in reference to the enclosed drawings.

DETAILED DESCRIPTION

Figure 1:
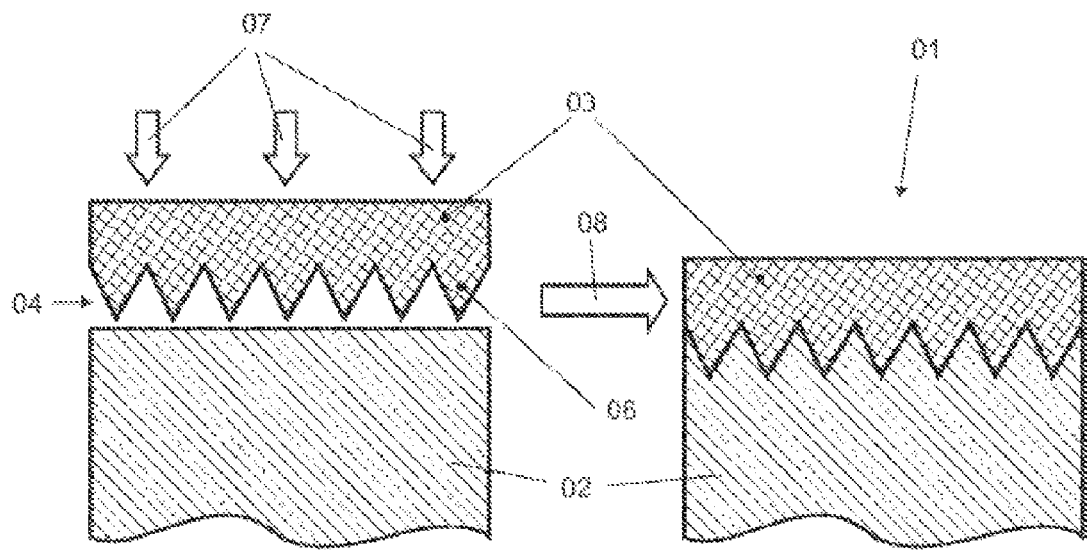
FIG. 1 is a schematic representation of the process steps for the manufacture of a silicon ceramic composite substrate according to the invention.

FIG. 1 presents a schematic representation of the process steps for the manufacture of a silicon ceramic composite substrate according to the invention.

A silicon substrate is provided onto an unprocessed or green low-temperature ceramic 02, which includes one or more ceramic layers. The ceramic 02 may include a wiring structure with conduction paths, plated through-hole (vias), resistors, coils, capacitors and fluidic channels (not shown). The silicon substrate 03, which has a contact area 04 with a nanostructure 06, is laminated under the effects of pressure and temperature without the use of any additional means. The silicon substrate 03 may be a silicon wafer that is completely or partially nano-structured.

The nano-structure 06 of the surface of the silicon substrate 03 can thereby be realized, for example, by means of a self-masking plasma-etching process, whereby the geometric dimensions of the needle-like nano-structures 06 produced thereby are preferably adapted to the powder morphology of the green low-temperature ceramic 02 (for example the kernel size of the solids of the raw ceramic). Therefore, the needles in the needle structure are preferably spaced apart from one another in the range of the kernel size of the solids of the raw ceramic.

The lamination process is implemented in a press (indicated in FIG. 1 by the arrows 07), at temperatures between 80° C. and 120° C. in a time span of 1 to 30 minutes, for example.

Subsequently, the firmly bonded and/or positively locking silicon ceramic composite substrate 01 is preferably manufactured in a pressure sintering process (indicated in FIG. 1 by the arrow 08) at temperatures up to 950.

During lamination, the needle-like nano-structures 06 completely penetrate into the low-temperature ceramic 02 to thereby achieve a tight bond that permits fluid channels present in the low-temperature ceramic to be guided along the silicon. This can be advantageously utilized for cooling the structure that is subsequently created in the silicon. The cooling channels that are generated are particularly effective with respect to the silicon because of the large surface area that is provided by the nano-structure 06.

Figure 2:
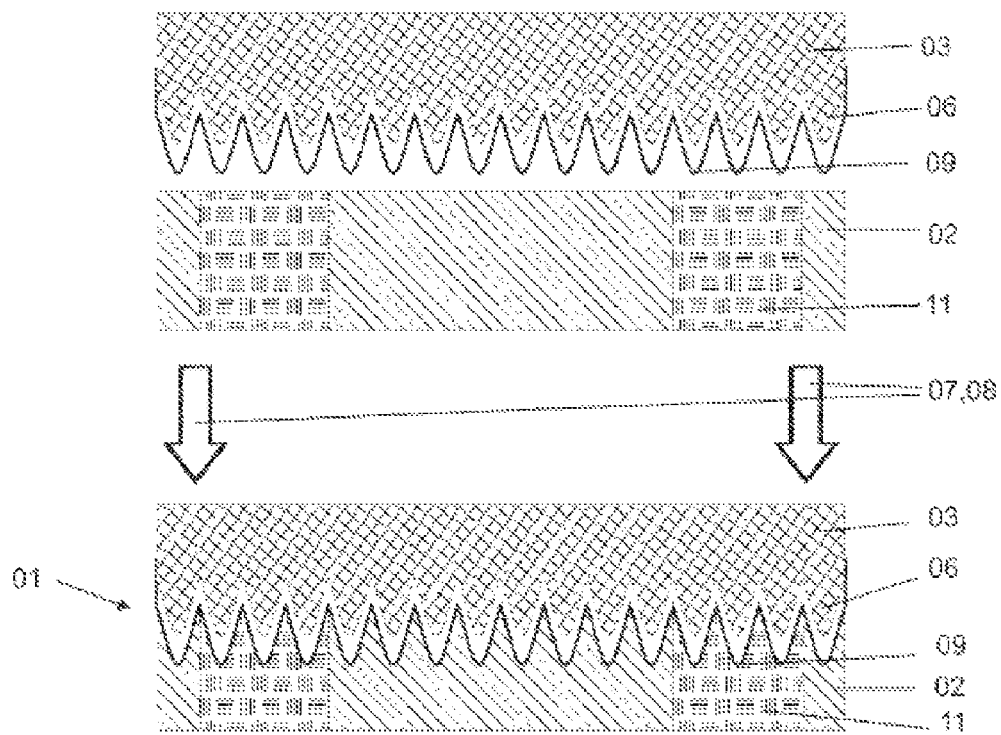
FIG. 2 is a schematic representation of the manufacture of an electrical contact in a silicon ceramic composite substrate.

FIG. 2 presents a schematic representation of one embodiment of the invention. If a metallization 09 is applied to the needles of the nano-structure 06 prior to lamination, an electrical bond can be established during the sintering between the conduction paths that are present on the low-temperature ceramic 02 (not shown) (or metallic vias 11 formed in the ceramic 02) and the metallization 09 that is present on the silicon substrate 03.

The silicon ceramic composite substrate 01 that is created in this manner, which is characterized by its very high strength, preferably has an outer dimension or contour that is the same as a standard wafer (for example 4") and is therefore compatible with all installations and devices for subsequent semi-conductor processing (e.g., lithography, thin-film techniques, plasma structuring methods etc.).

If the ceramic-silicon composite substrate 01 according to the invention is manufactured in the described fashion and further processed, the silicon substrate 03 itself does not need to have high mechanical strength since the low temperature ceramic 02 takes on this carrier function during subsequent technological follow-on steps. This means that the silicon substrate 03 only has to be sufficiently thick so as to assure that electronic functions can be implemented therein by suitable fabrication of electrical devices, which again leads to significant material savings. Furthermore the process time for etching, for example, can be significantly reduced if the silicon layer features only a minimum thickness.

An advantageous thickness for the silicon substrate 03 is approximately in the range of 50 to 100 micrometers.

Similar to the case of SOI (Silicon On Insulator) technology, silicon is applied only where it is functionally required.

Figure 3:
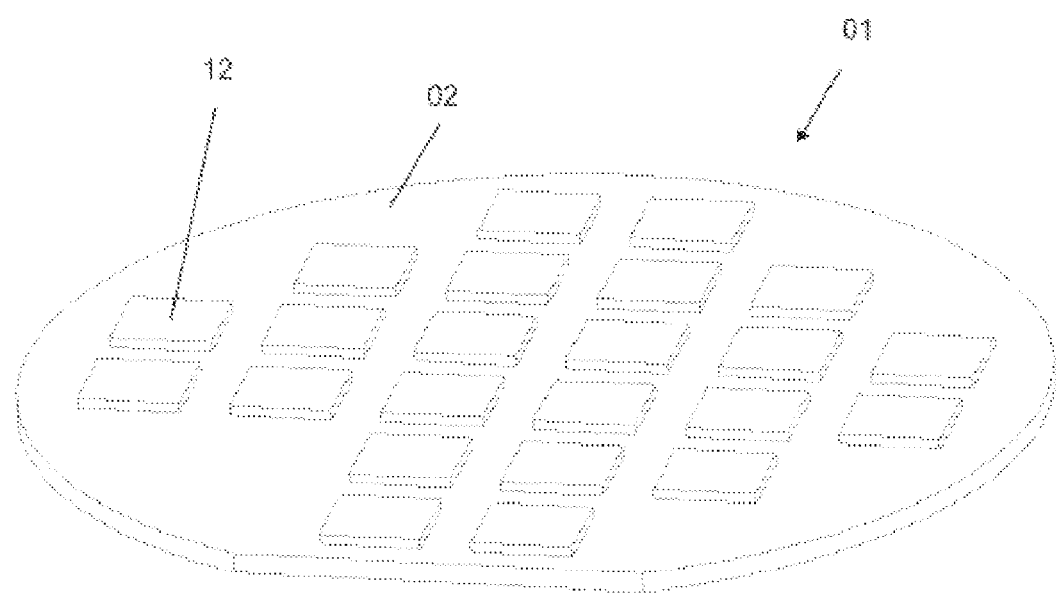
FIG. 3 is a schematic representation regarding the separation of silicon chips on a silicon ceramic composite substrate.

In FIG. 3 the silicon ceramic composite substrate 01 is divided into functional areas, which are defined during subsequent processing. In this example the functional areas are represented by chips 12 in the silicon plane. This can be accomplished by means of standard silicon etching processes (for example reactive ion etching—DRIE), whereby the surface of the low-temperature ceramic 02 functions as a natural etch stop.

The standard technologies for preparation and processing of the low-temperature ceramic permit an economical integration of electrical, fluidic, and optical interfaces to the periphery.

The manufacture of the silicon ceramic composite substrates according to the invention requires no additional devices such as chip bonders or bond installations for anodic bonding. However, the manufacture of these substrates may use installations that are already present for use in standard semiconductor and LTCC technology processes.

The invention claimed is:

1. A composite substrate, which is configured with dimensions corresponding to a wafer standard and which is compatible with installations and devices for subsequent semi-conductor processing comprising:
    a low-temperature ceramic having at least one pre-formed ceramic layer; and
    a silicon substrate having a surface with nano-structures formed on at least a portion thereof, the nano-structures penetrating into the low-temperature ceramic, wherein the low temperature ceramic forms a carrier-layer for the silicon substrate.

2. The composite substrate of claim 1, wherein the ceramic has a powder morphology and the nano-structures have geometric dimensions adapted to the powder morphology.

3. The composite substrate of claim 2, wherein the nano-structures are needle-shaped and a spacing between the needle-shaped structures corresponds to a kernel size of powder-shaped components in the low-temperature ceramic.

4. The composite substrate of claim 1, wherein the low-temperature ceramic has vias, conduction paths and/or fluid channels.

5. The composite substrate of claim 3, wherein the low-temperature ceramic has vias, conduction paths and/or fluid channels.

6. The composite substrate of claim 1, wherein the nano-structures have metallization applied thereto.

7. The composite substrate of claim 5, wherein the nano-structures have metallization applied thereto.

8. The composite substrate of claim 7 further comprising an electric connection between the metallization of the silicon substrate and the conduction paths and/or vias.

9. The composite substrate of claim 1 wherein the silicon substrate has a thickness no greater than necessary to fabricate electronic devices thereon.

10. The composite substrate of claim 1 wherein the silicon substrate has a thickness of 50 to 100 micrometers.

11. A method of forming a silicon-ceramic composite substrate, comprising:
    providing a green ceramic foil that includes one or more green ceramic foil layers including a carrier layer;
    providing a silicon substrate having a nano-structure on its surface;
    laminating the nano-structured surface of the silicon substrate onto the carrier layer with application of pressure and temperature to thereby cause the nano-structure to penetrate into the carrier layer.

12. The method of claim 11, wherein laminating the nanostructured surface includes applying a pressure sintering process at a temperature no greater than 950° C.

13. The method of claim 11, further comprising forming conduction paths, vias and/or fluid channels in or on the ceramic foil.

14. The method of claim 11, further comprising forming resistors, capacitors, and/or coils in or on the ceramic foil.

* * * * *